United States Patent [19]

Tong et al.

[11] Patent Number: 4,970,578
[45] Date of Patent: Nov. 13, 1990

[54] SELECTIVE BACKSIDE PLATING OF GAAS MONOLITHIC MICROWAVE INTEGRATED CIRCUITS

[75] Inventors: Elsa K. Tong, Wayland; Thomas E. Kazior, Sudbury, both of Mass.

[73] Assignee: Raytheon Company, Lexington, Mass.

[21] Appl. No.: 250,193

[22] Filed: Sep. 28, 1988

Related U.S. Application Data

[62] Division of Ser. No. 44,685, May 1, 1987.

[51] Int. Cl.$^5$ .................... H01L 19/00; H01L 23/34
[52] U.S. Cl. ........................ 357/81; 357/55; 357/49; 357/71; 357/68
[58] Field of Search ............ 357/80, 81, 49, 71, 357/68, 55; 437/170, 203

[56] References Cited

U.S. PATENT DOCUMENTS

| | | | |
|---|---|---|---|
| 3,986,196 | 10/1976 | Decker et al. | 357/81 |
| 4,091,408 | 5/1978 | Lee et al. | 357/81 |
| 4,374,394 | 2/1983 | Camisa | 357/81 |
| 4,376,287 | 3/1983 | Sechi | 437/180 |
| 4,571,611 | 2/1986 | Kashiwagi | 357/81 |
| 4,601,096 | 7/1986 | Calviello | 357/22 H |
| 4,751,562 | 6/1988 | Yamamura | 357/80 |
| 4,794,093 | 12/1988 | Tong et al. | 437/170 |
| 4,807,022 | 2/1989 | Kazior et al. | 437/203 |
| 4,818,724 | 4/1989 | Cetronio et al. | 437/203 |
| 4,823,174 | 4/1989 | Itoh et al. | 357/56 |
| 4,827,610 | 5/1989 | Williams et al. | 29/840 |
| 4,868,613 | 9/1989 | Hirachi | 357/55 |
| 4,896,194 | 1/1990 | Suzuki | 357/55 |

FOREIGN PATENT DOCUMENTS

| | | | |
|---|---|---|---|
| 62-128179 | 6/1987 | Japan | 357/65 |
| 62-268147 | 11/1987 | Japan . | |
| 2046514 | 11/1980 | United Kingdom | 357/68 |

Primary Examiner—Andrew J. James
Assistant Examiner—Viet Q. Nguyen
Attorney, Agent, or Firm—Denis G. Maloney; Richard M. Sharkansky

[57] ABSTRACT

A technique for etching tub structures and vias on the backside of a wafer comprised of gallium arsenide and for providing a planar surface on said backside of the gallium arsenide wafer is described. The tubs are formed by providing a layer of resist over the backside of the gallium arsenide substrate, and this layer is patterned to provide selected areas covering regions where tub structures and vias will be provided. In the selectively exposed regions, palladium and gold are sequentially deposited. The resist pattern is then stripped, and a second resist layer pattern is deposited masking portions of the continuous conductive layer and areas where vias are to be provided. The tub structures are then provided by suitably etching the tub to undercut portions of the resist and the palladium layer. A second continuous conductive coating is then provided in the tub structure to provide a plating layer for subsequent plating of a gold film over the palladium. Preferably, the gold is plated to completely or substantially completely fill the tub. The vias are then provided on the backside of the wafer by masking the first continuous conductive coating and the tub regions and etching the unexposed regions of the substrate to provide the via holes. The via holes are then plated with a continuous conductive layer of palladium and then gold to substantially fill the via.

6 Claims, 5 Drawing Sheets

SELECTIVE BACKSIDE PLATING OF GAAS MONOLITHIC MICROWAVE INTEGRATED CIRCUITS

The Government has rights in this invention pursuant to Contract No. F33615-84-C-1536 awarded by the Department of the Air Force.

This application is a divisional application of Ser. No. 044,685, filed May 1, 1987.

BACKGROUND OF THE INVENTION

This invention relates generally to semiconductor circuits and more particularly to fabrication of semiconductor circuits having improved thermal transfer characteristics.

As is known in the art, gallium arsenide is a preferred material for high operating frequency and high speed monolithic integrated circuits. In particular, with monolithic microwave integrated circuits, a gallium arsenide substrate supports an active layer in which active devices are provided, and further supports other circuit devices including transmission lines, capacitors, and resistors. These particular circuits may be classified as analog circuits and, therefore, can encompass the various types of analog circuits including high power circuits. For high power circuits such as power amplifier circuits, an individual heat dissipating device such as a field. effect transistor can have a channel temperature which often exceeds 200° C. during operation. In general, the temperature of the device influences the performance, the characteristics, and the reliability of the device. Further, when channel temperatures in transistors exceed 200° C. premature device failure may occur. Therefore, heat must be efficiently removed from the device in order to minimize changes in device performance and the risk of premature failure of the device.

To accomplish this heat removal, typically the backside surface of the substrate, that is, the surface of the substrate, not having formed thereon the active devices is provided with a "heat sink/ground plane" comprised of a highly thermally and electrically conductive material such as gold. Gallium arsenide, however, has a relatively low thermal conductivity in comparison to conductive materials such as gold. Therefore, it would be desirable from a device heat sinking perspective to provide a very thin substrate of gallium arsenide to thereby better effectively remove the heat from the gallium arsenide circuits.

On the other hand, gallium arsenide is also a relatively fragile and mechanically weak material. Therefore, from the perspective of manufacturing and handling, a relatively thick substrate is desirable since it would be less susceptible to damage during manufacturing and handling of the substrate.

Moreover, in many analog circuits, the gallium arsenide substrate acts as a dielectric for strip conductor type transmission lines and, therefore, the thickness of the gallium arsenide substrate is also a consideration from a device properties perspective.

Accordingly, considerations other than the effectiveness of removing heat from heat dissipating elements such as transistors often dictate the thickness of the gallium arsenide substrate. A solution to this problem has been to provide a so-called "tub structure" in which the gallium arsenide is selectively thinned in a region underlying the heat dissipating device providing a region which can be filled with a conductive material, to attempt to reduce the thermal resistance between the heat dissipating element and the heat sink/conductive layer formed on the backside of the gallium arsenide substrate.

One problem, however, presented by the formation of this so-called "tub structure" is the difficulty in providing a uniformly thick heat sink layer over the backside of the substrate and conductively filled tub structure. This problem is particularly evident in circuits also having via hole structures. Via hole structures are holes provided completely through the substrate to interconnect with conductors formed on the opposite surface of the substrate or the so-called "frontside" of the substrate. Due to the significant differences in the depths of the tub structure and the depth of the via hole, conventional plating techniques directly replicate these gross topological feature differences in the ground plane.

It would be desirable to provide a substantially uniform and a continuous layer which may be used to mount the semiconductor device on a carrier, for example, and thereby provide a better heat sink and electrical contact with the carrier. A smooth ground plane is desired because, typically, the ground plane portion of the chip is soldered to the chip carrier. However, with the gross topological features replicated in the ground plane, voids or air pockets develop between the tub and the carrier due to incomplete wetting or filling of the voids underlying the tubs with solder when mounting the ground plane portion of the substrate to the carrier. These voids or air pockets result in "hot spots" which can negate any advantages achieved from introduction of the tub structure.

SUMMARY OF THE INVENTION

In accordance with the present invention, a method of forming a substantially uniform and continuous backplane conductor over a substrate having a pair of recesses of different depths, said recesses having a solid deposit of conductive material disposed therein is provided by forming a first continuous conductive layer over selected portions of the backside surface of the substrate with unselected portions of said backside surface exposed. A first one of the exposed portions of the backside surface of the substrate is masked as is the first continuous conductive layer, whereas a second one of the exposed portions is left exposed. A recess having a first selected depth is formed in the back surface of the substrate in the region of the second exposed portion. A second continuous conductive layer is then disposed in said recess, in electrical contact with the first continuous conductive layer. A layer of a conductive material is deposited in the recess preferably by plating over said second continuous conductive layer to fill or substantially fill said recess. The first continuous conductive layer and the recess having the conductive material disposed therein are masked while said first one of the exposed backside surface portions of the substrate is left exposed. From this exposed first portion of the backside surface of the substrate is provided a second recess having a second, different depth into the substrate. A third continuous conductive layer is then formed in this second recess and is provided in electrical contact with said first continuous conductive layer. A layer of a conductive material is disposed in the second recess, preferably by plating in the second recess to fill or substantially fill the second recess. With this particular arrangement, recesses of different depths provided in a surface of a substrate are substantially filled with a conductive material. Since the holes are substantially filled and a thin continuous conductive layer remains on the backside surface of the substrate, the backside surface of the substrate may be provided with a substantially uniformly thick and smooth layer of conductive material without replicating the gross topological features caused by the presence of the recesses. Therefore, such a substrate having the substantially uniform conductive layer on the back surface thereof is soldered to a carrier without the voids and air pockets that are typically formed between such carriers and conductive layers using prior techniques.

In accordance with a further aspect of the present invention, a tub structure and a via hole are provided in a backside surface of a substrate. The tub and via holes are each provided with a solid deposit of a conductive material which are disposed in conductive contact with a substantially uniformly thick conductive layer disposed over the backside surface of the substrate. A first continuous conductive layer is disposed over selected portions of the backside surface of the substrate. The first continuous conductive layer and a first exposed portion of said backside surface of substrate are masked leaving a second exposed portion of said backside surface of the substrate exposed. This unmasked, exposed second portion is etched to provide a tub structure partially through the substrate having a first depth. A solid deposit of a thermally conductive material is disposed in said tub to substantially fill said recess. Preferably, the conductive material is provided by electrolessly plating a material into portions of the substrate exposed in the tub to form a thin conductive, adherence layer in electrical contact with said first continuous conductive layer. A conductive material is then plated in said tub structure using the second continuous conductive layer as an adhesion layer, diffusion barrier, and continuity layer for the plated conductive material, with the conductive material being plated to substantially fill said recess. The first continuous conductive layer and the plated recess are then masked leaving exposed said first exposed portion. The first exposed portion of the substrate is etched to provide a via hole completely through the substrate. A solid deposit of an electrically conductive material is disposed in the via preferably by electrolessly plating the exposed substrate portions in the via to provide a third continuous conductive layer in said via hole disposed in electrical contact with said first continuous conductive layers. A conductive material is then plated over said third continuous conductive layer to substantially fill said recess. A heat sink layer is disposed over the backside of the wafer to provide a relatively thick heat sink and electrical ground plane on the back of the substrate. With this particular arrangement, the tub and via structures provided in the semiconductor substrate are substantially filled with a solid deposit of a conductive material, and provide in combination with the continuous conductive layer a substantial smooth and uniform surface on the backside of the substrate for subsequent formation of the ground plane/heat sink layer. The ground plane/heat sink layer provided over this surface has a substantially uniform thickness, and smooth and uniform surface topography. By providing separate continuous conductive layers, the recesses may be individually filled with conductive material assuring a solid, uniform deposit of material is provided within each recess.

BRIEF DESCRIPTION OF THE DRAWINGS

The foregoing features of this invention, as well as the invention itself, may be fully understood from the following detailed description of the drawings, in which.

DESCRIPTION OF THE PREFERRED EMBODIMENTS

Figure 1:
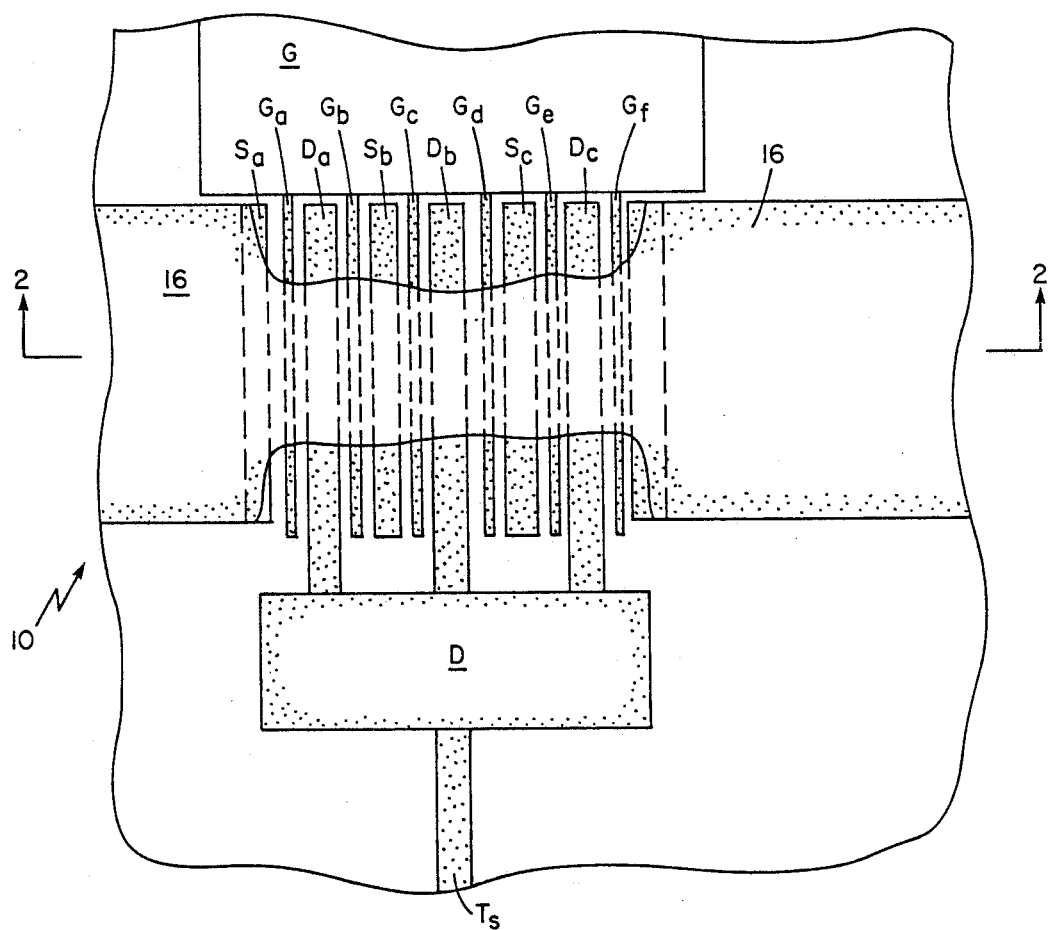
FIG. 1 is a plan view of the circuit including a multicell field effect transistor having a source overlay metalization.
Figure 2:
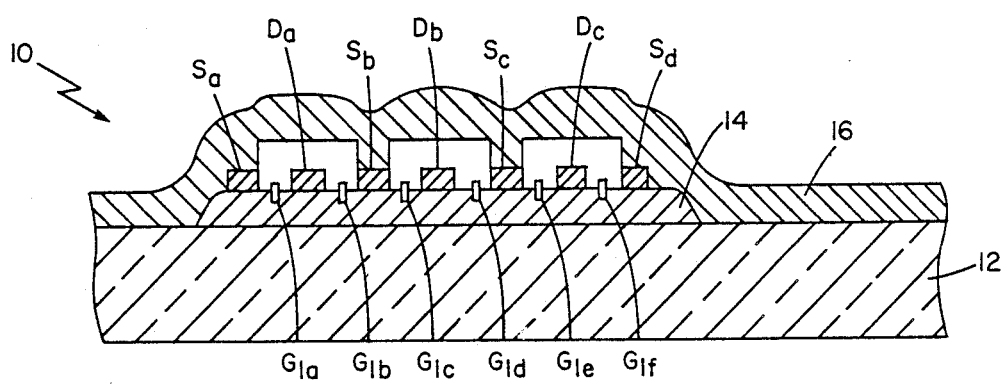
FIG. 2 is a cross-sectional view taken along lines 2—2 of FIG. 1.

Referring now to FIGS. 1 and 2, a field effect transistor 10 is shown to include a plurality of source regions $S_a$–$S_d$ interconnected via a common source overlay 16, a plurality of drain regions $D_a$–$D_c$ interconnected to a common drain pad D, and a plurality of gate electrode fingers $G_a$–$G_f$ interconnected to a common gate pad G and disposed to space respective ones of source and drain regions, as shown. Drain electrode D is connected to a strip conductor $T_s$ which forms part of a microstrip transmission line. The field effect transistor 10 further includes an active region 14 here an epitaxially grown, etched mesa region, suitably doped here N-type, over which drain and source electrodes are provided in ohmic contact and the gate electrodes are provided in Schottky barrier contact Other types of active regions such as ion implanted regions may also be used. The electrodes and active layer 14 are supported by a substrate 12 here also of gallium arsenide. Substrate 12 also provides support for portions of the source overlay 16 and strip conductor $T_s$. Source overlay 16 is to be interconnected to a ground plane conductor disposed on an opposite surface of the substrate 12 through a via hole, as will be described. The substrate 12 being semi-insulating also provides the dielectric for the microstrip transmission line (not numbered) formed by the strip contactor $T_s$ and the ground plane conductor, as will be described.

During operation of the transistor 10 heat is dissipated, causing a rise in the temperature of the region disposed between the source and drain electrodes As previously mentioned, it is desirable to efficiently remove the dissipated heat from the transistor 10 to reduce changes in the electrical properties of the transistor 10 and prevent premature failure of the transistor 10.

Referring now to FIGS. 3A-3H, steps in the formation plated via hole 38 (FIG. 3F) to interconnect the source overlay 16 to a ground plane conductive layer 40 (FIG. 3H), and a tub 30 (FIG. 3D) disposed under the field effect transistor 10 to provide a lower thermal resistance path between the field effect transistor 10 and the ground plane conductive layer 40 (FIG. 3H) will now be described. It is to be noted that in views subsequent to FIG. 3A, the frontside 12' details shown in FIG. 3A have been omitted for clarity.

Figure 3A:
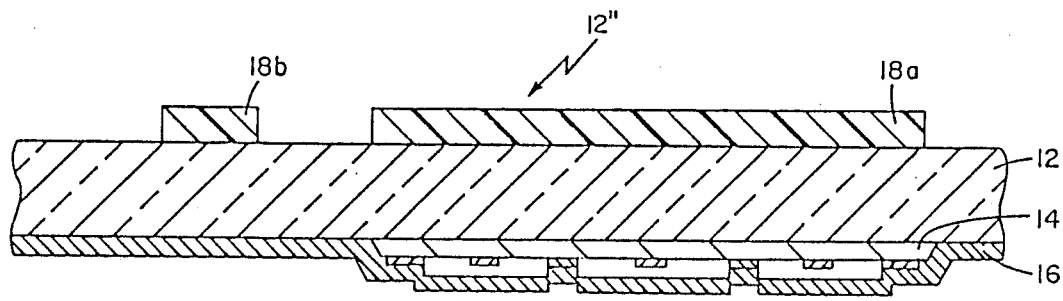
FIGS. 3A-3H are a series of cross-sectional views showing the steps in fabricating the tub and via hole structures in accordance with the present invention.

Referring now to FIG. 3A, after frontside processing of the substrate 12 as shown in FIG. 1, the frontside 12' is mounted on suitable carrier in a suitable material (not shown) to protect the frontside during the processing now to be described. Typically, the backside 12" of the substrate 12 is thinned using conventional techniques to a thickness of 100 microns, for example. This thickness for the substrate 12 will provide sufficient dielectric separation for transmission lines formed between strip conductors on the frontside 12' of the substrate 12 (i.e. $T_s$) and the ground plane 40 (FIG. 3H), and also will provide sufficient mechanical integrity to the substrate 12 to permit subsequent handling of the substrate 12. However, since GaAs has a lower thermal conductivity than conductive materials such as gold, the substrate 12 as is will hinder thermal dissipation from heat dissipating elements such as the field effect transistor 10 disposed on the frontside 12' of the substrate 12.

As shown, the backside 12" of the substrate 12 is coated with a masking layer here of photoresist, and is patterned to provide regions 18a, 18b which will correspond to the locations 21a, 21b for tub structures and via holes, respectively. The resist is chosen such that when developed the resist remains in situ on those areas chosen for the formation of tub and via structures, and is removed from the remainder of the backside 12" of the substrate 12, as shown.

Figure 3B:
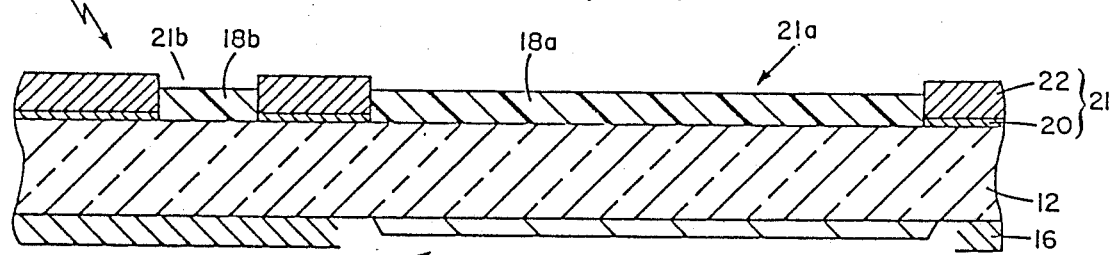

Referring now to FIG. 3B, a continuous conductive layer 21 is provided over unmasked portions of the substrate 12. Preferably, a first layer 20 is formed by electrolessly plating a material such as palladium onto exposed portions of the substrate 12. The electrolessly plated palladium is provided by dipping the exposed gallium arsenide portions into a solution containing palladium. A source of such a solution is "Techni Electroless Palladium" from Technic Inc., Cranston R.I., which contains ammonium palladium chloride as the palladium vehicle. The palladium containing solution and the gallium arsenide react to form a thin layer 20 of palladium which adheres to the gallium arsenide but not to the resist. This thin layer 20 of palladium is used as a continuity layer. Thus, a relatively thin electroplated layer of gold 22 is plated thereover, as shown. Typically, the palladium layer 20 has a thickness of about 100A to about 1000A preferably 400A to 600A and the plated layer 22 layer has a thickness between 1,000 and 20,000A preferable between 8,000A to 12,000A. Accordingly, as shown in FIG. 3B, the thickness of layer 21 is exaggerated to better show this feature.

Other techniques may be used to provide a continuous conductive layer over selected regions of the substrate 12. For example, a layer may be deposited over the entire backside of the substrate and then patterned to remove the layer in those regions corresponding to the location for tub and via structures. Alternatively, a lift-off technique may be used where a patterned photoresist layer is provided over the substrate and a layer of metal is deposited over the photoresist and exposed portion of the substrate provided by the patterned layer. The photoresist is then removed leaving behind the patterned conductive layer.

Figure 3C:
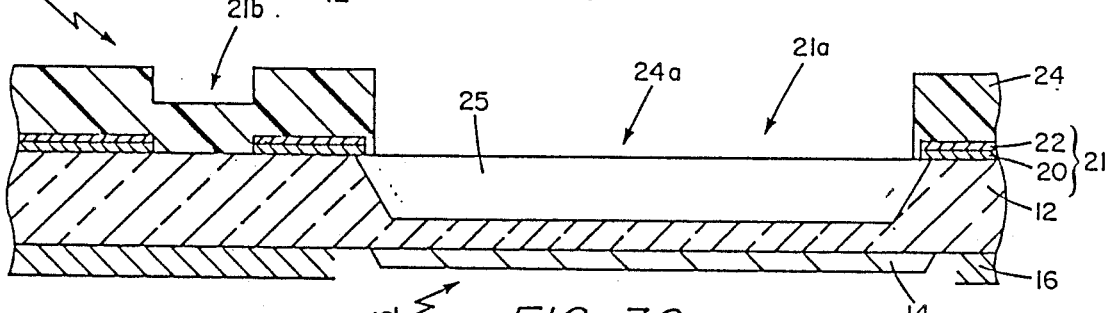

Referring now to FIG. 3C, after the composite, continuous conductive layer 21 is formed, the photoresist patterned regions 18a, 18b are removed. A second masking layer 24 here of photoresist is disposed over the backside 12" and is patterned to provide an aperture 24a which exposes the location for a tub structure 21a underneath the transistor 10 and which masks the continuous conductive layer 21 and regions reserved for formation of via holes 21b. The resist is patterned preferably so that it overlaps all of the continuous conductive layer 21 thereby, preventing plating of edge surfaces of continuous conductive layer 21 during subsequent plating steps, as will be described. A recess 25 is formed by etching away exposed portions of the gallium arsenide substrate to a predetermined depth underneath the field effect transistor 10. Typically, the recess is etched to a uniform depth in the range of about 50% to 80% of the thickness of the substrate 12 or here to a depth in the range of about 50 to 80 microns. Any suitable etchant may be used, here a Freon −12" plasma ($CCl_2F_2$) etch is chosen. The recess 25 is formed such that sidewalls of the recess 25 undercut the first continuous conductive layer 20.

Figure 3D:
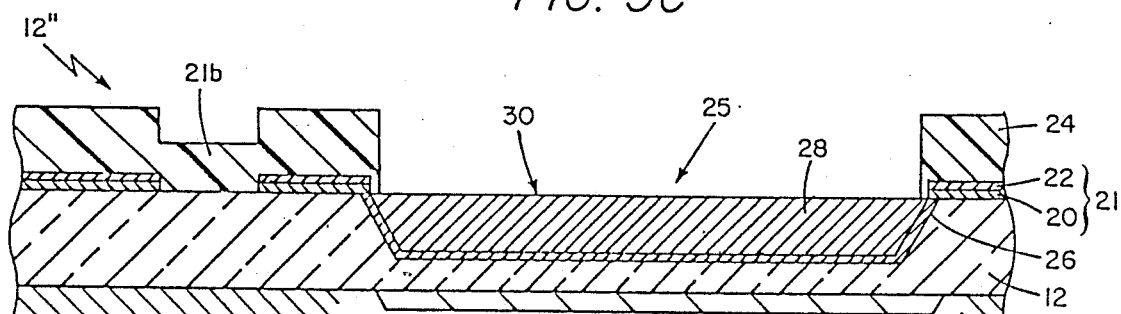

Referring now to FIG. 3D, after the recess 25 is formed, the exposed gallium arsenide is brought into contact with a solution containing palladium, as mentioned previously, to provide a second continuous conductive coating layer 26 to cover portions of the gallium arsenide exposed by the recess 25. This second continuous conductive coating 26 is disposed in electrical contact relationship with the first continuous conductive coating layer 20 to provide a composite, continuous conducting coating surface which is used to plate a thermally conductive material such as gold within the tub to provide a solid, thermally conductive layer 28, as shown. The continuous conductive layer 26 and solid conductive layer 28 provides a tub 30 filled with a thermally conductive material, as shown.

Figure 3E:
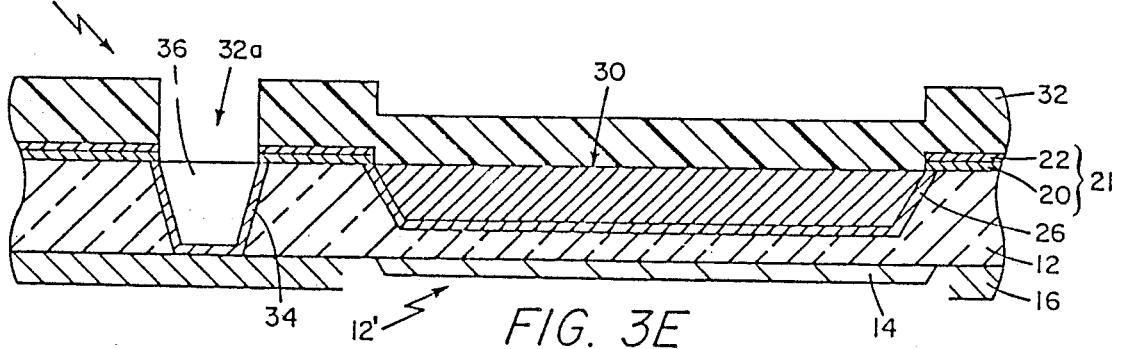

Referring now to FIG. 3E, the previously provided second masking layer 24 is removed, and a third masking layer 32 is provided to mask the continuous conductive coating layer 21, and the conductively filled tub 30. The third masking layer 32 is patterned to provide an aperture 32a in the layer 32 which exposes the underlying substrate 12 in region 21b (FIG. 3D). A second recess 36 is etched completely through the gallium arsenide substrate exposing the source overlay metalization 16. Again, the recess 36 is etched as before such that it undercuts the continuous conductive coating 21. A third continuous conductive layer 34 is provided on sidewalls of the recess 36 using palladium containing solution, as described above.

Figure 3F:
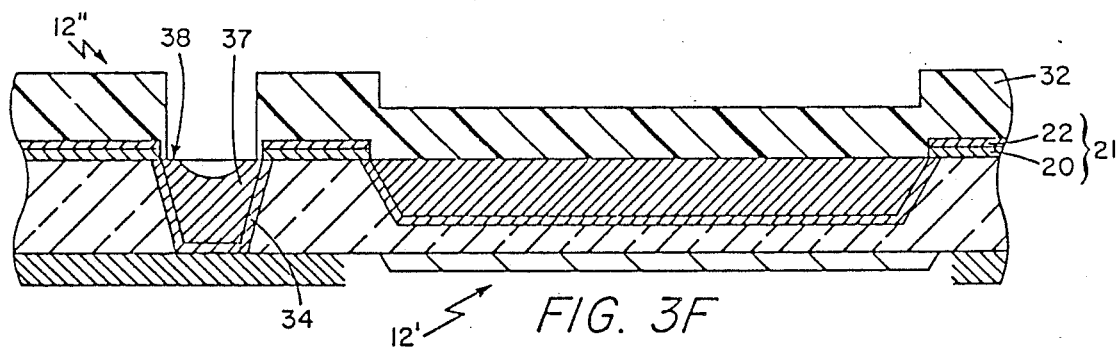

Referring now to FIG. 3F, the third continuous conductive layer 34 in combination with layer 21 provides a continuity plating layer to permit plating of a conductive material 37 here gold to fill the aperture 36 (FIG. 3E) and thereby, provide a plated via 38, as shown.

Figure 3G:
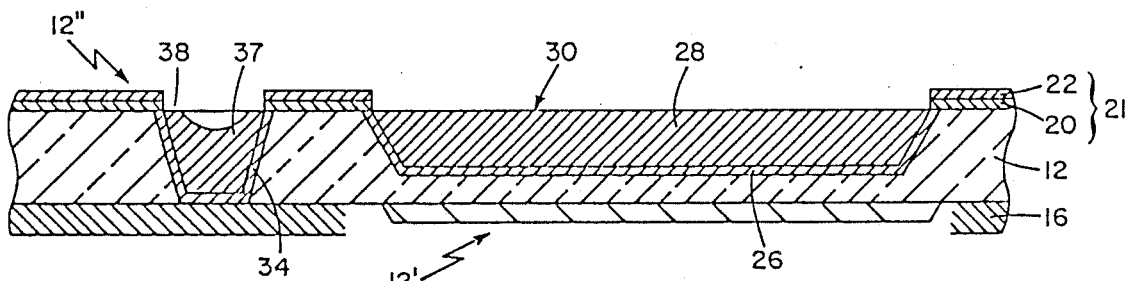

Referring now to FIG. 3G, the third layer of photoresist 32 is stripped away leaving the backside surface 12" of substrate 12 with a substantially uniformly thick, continuous conductive layer provided by layer 21 and exposed surfaces of the via 38 and tub 30.

Figure 3H:
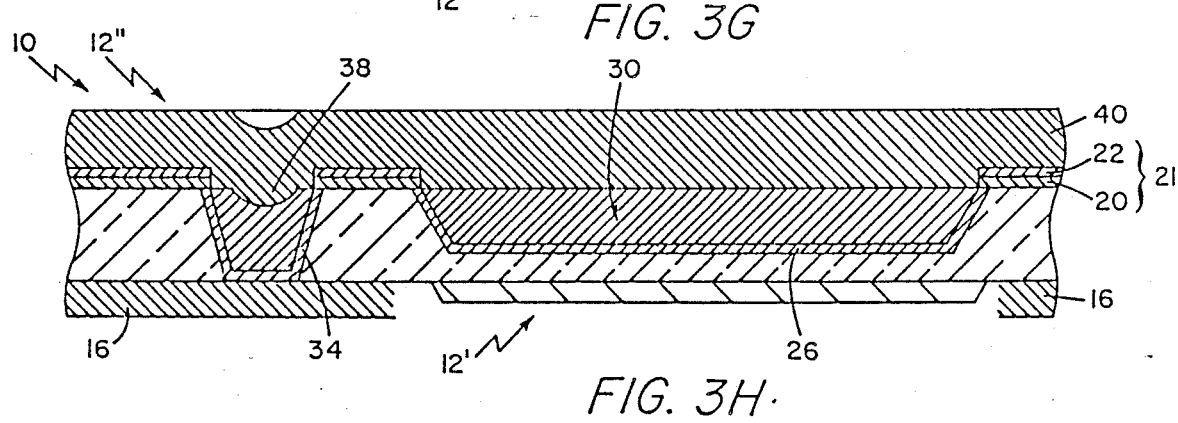
Figure 4:
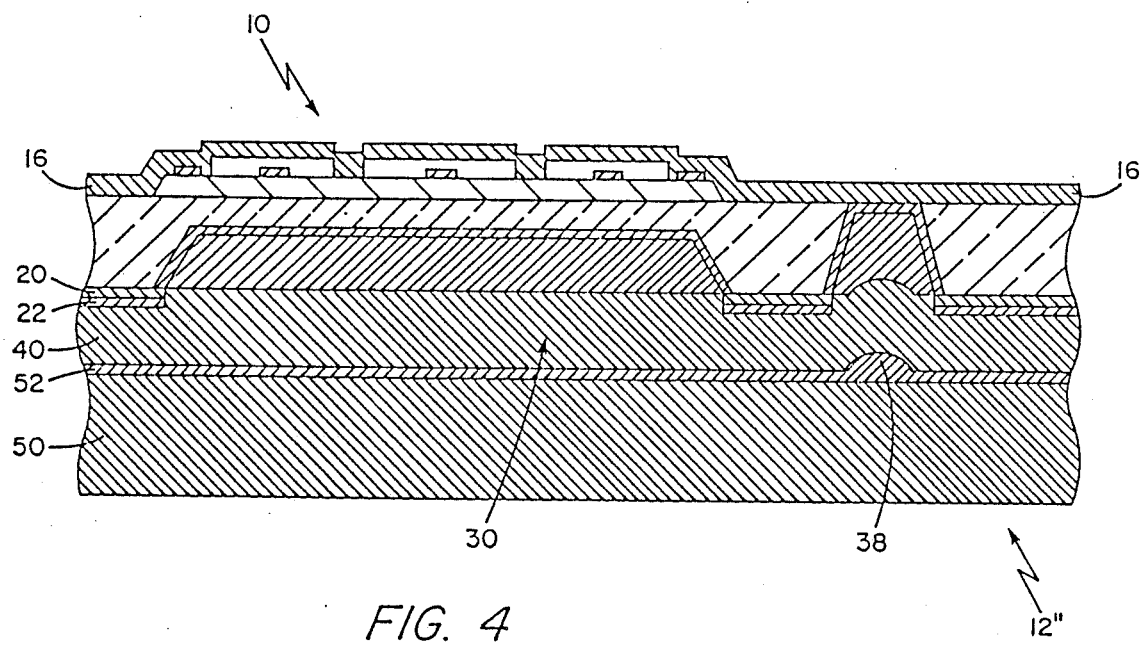
FIG. 4 is a cross-sectional view showing the device of FIG. 3H mounted on a carrier.

As shown in FIG. 3H over the layer 21, tub 30, and via 38 is provided a relatively thick, continuous conductive layer 40 which functions as a heat sink, a bonding surface to a carrier 50 (FIG. 4), and a ground plane for the semiconductor circuit. Here, the layer 40 is plated using the composite, continuous conductive surface to a thickness of typically 0.5 mil. Accordingly, as shown in FIG. 4 with this arrangement, the plated layer 40 on backside surface of the substrate 12 will be substantially uniform and thus, it may be bonded to a carrier 50 with a conductive adhesive 52 such as solder without air pockets or voids and thus will provide a low thermal resistance path between the transistor 10 and the carrier 50.

Figure 5A:
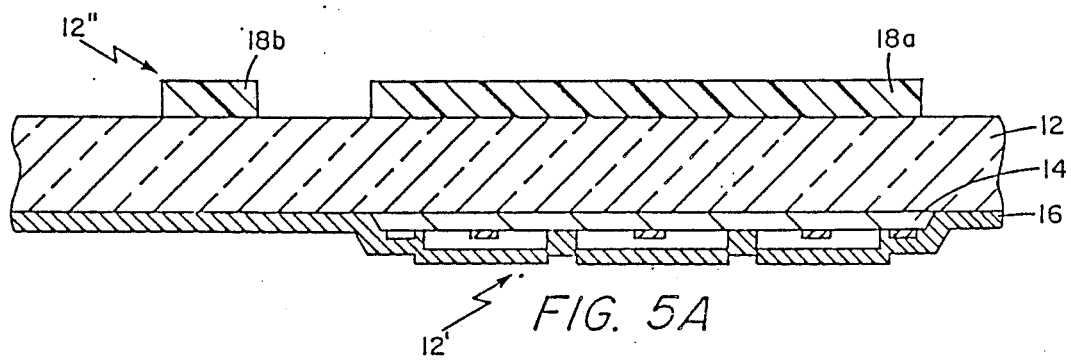
FIGS. 5A-5F are cross-sectional views showing steps in fabricating the tub and via structures in accordance with an alternate embodiment of the present invention.
Figure 5B:
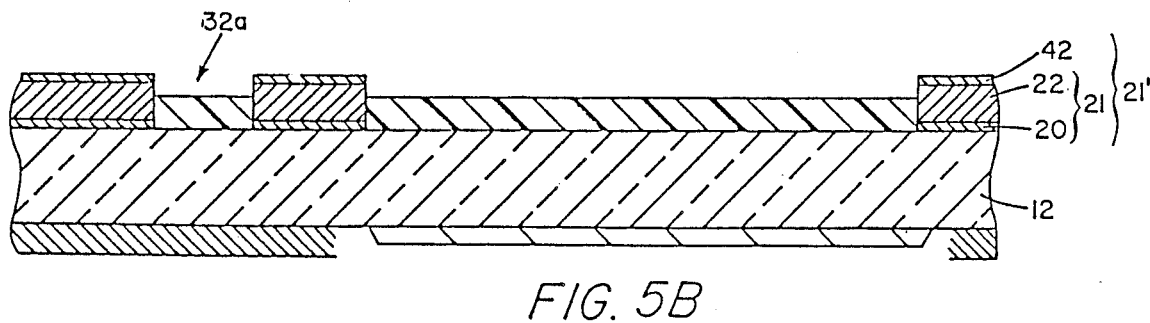
Figure 5C:
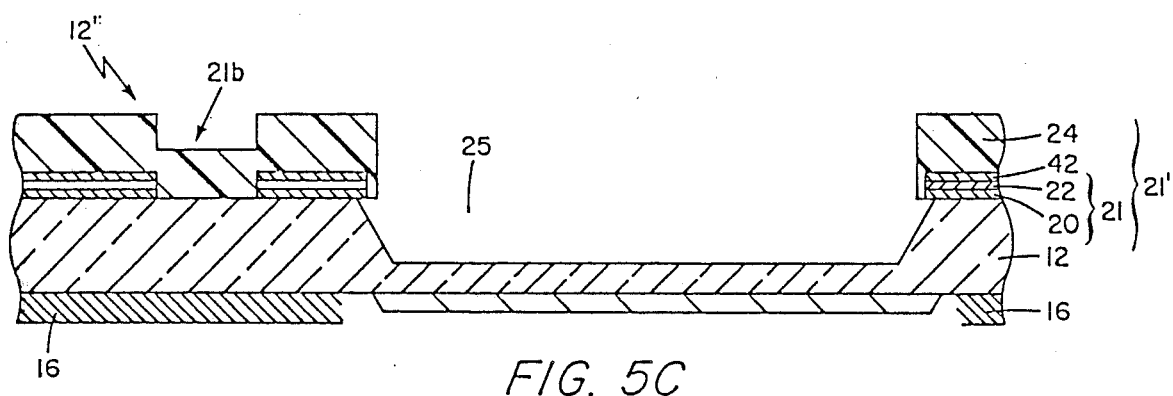
Figure 5D:
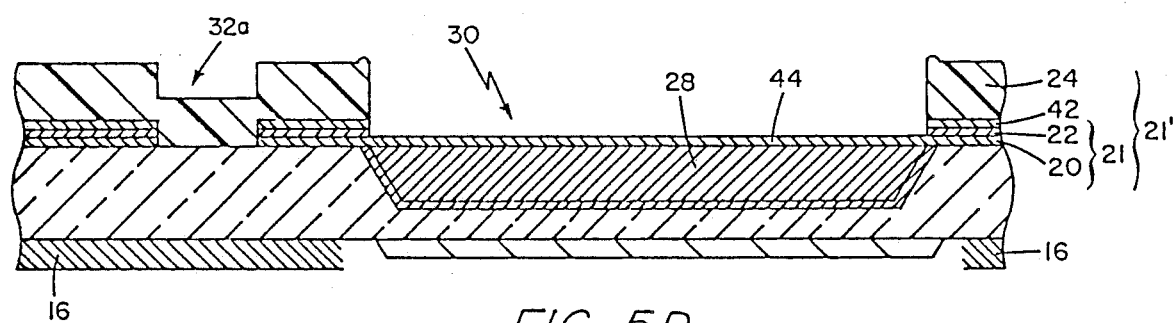

Referring now to FIGS. 5A–5F, an alternate embodiment of the present invention is shown. Referring first to FIG. 5A, a photoresist layer is patterned to provide the regions 18a and 18b, as described in conjunction with FIG. 3A. As shown in FIG. 5B, a composite, continuous conductive coating layer 21 is then formed, as generally described in conjunction with FIG. 3B. Disposed over the continuous conductive coating 21 is a third conductive layer, here a metal masking layer 42 comprised of a dissimilar metal to the metal of layer 22 which will protect layer 22 during subsequent etching of the substrate. Layer 42 is here nickel although other metals such as a nickel chromium alloy may be used to provide a composite, continuous conductive layer 21'. As shown in FIG. 5C, the continuous conductive coating layer 21', as well as, the regions 21b wherein vias are to be formed are masked with a second masking layer 24, as shown and as generally described in conjunction with FIG. 3C, and the recess 25 is formed from the exposed region of the substrate 12. The recess 25 is then electrolessly plated with a material to form the layer 26 and plated with a material such as gold to provide the layer 28 of gold which substantially completely fills the recess 25 to provide the tub 30, as described in conjunction with FIG. 3D. Here, however, a second metal layer 44 here of nickel, although nickel-chromium alloys may be used, is disposed over the layer of gold 28 to provide in combination with the first metal layer 42 disposed over the continuous conductive coating layer 21 a metal mask. During depositing of the layer 44, portions of said layer creep up under portions of the photoresist, as shown.

Figure 5E:
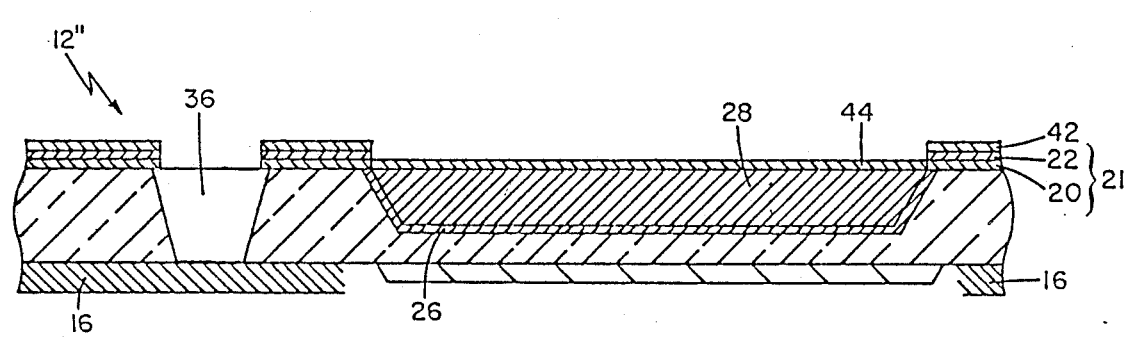

Referring now to FIG. 5E, the photoresist layer 24 is removed using conventional techniques. Remaining disposed on the continuous conductive coating 21 and recess 30, however, is the metal mask provided by the metal layers 42 and 44. Since the dissimilar metal here nickel is not over the region 22b where the via is to be formed, the nickel layers provide a mask for the etching of the via hole while protecting the gold layers 22 without an additional photolithographic masking step. The exposed gallium arsenide in region 22b is etched away, as generally described in conjunction with FIG. 3E to provide the via 36 which exposes the underlining source overlay metalization 16. The metal mask is used to isolate layer 21 and tub 30 from the etchant used to etch the substrate. Therefore, nickel layers 42 and 44 act as a masking layer during the via etching step and thus, reduce the number of photolithographic masking steps employed to practice this aspect of the invention.

Figure 6:
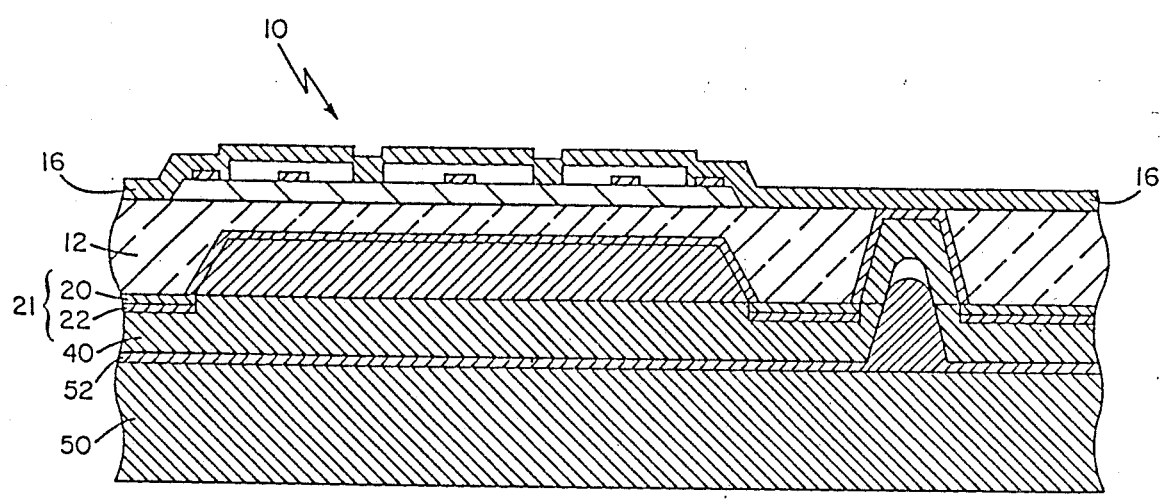
FIG. 6 is a cross-sectional view showing the device of FIG. 5F mounted on a carrier.
Figure 5F:
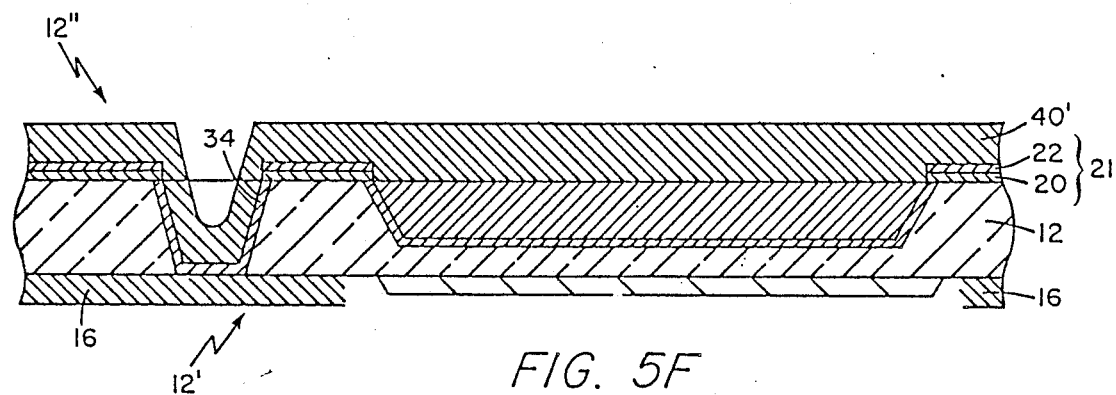

Referring now to FIG. 5F, the nickel layers 42 and 44 are stripped away from the continuous conductive layer 21 and from the tub recess 30 respectively by a HCl solution, as shown. After the via 36 has been etched and the mask 42 stripped away, a third continuous conductive layer 34 is provided by introducing the palladium containing solution into the via 36, as described in conjunction with FIG. 3E. Over the exposed via hole 36 having the third continuous conductive coating layer 34, the continuous conductive coating 21 and plated tub recess 30 is provided a heat sink/conductive bonding surface layer 40', here also 0.5 mil thick layer comprised of gold. Since the via hole region 36 was not previously plated to fill the region, layer 40' will have a slight depression in the region of the via 36. However, since the via 36 is used to make electrical contact from the backside 12" to the frontside 12' of the substrate 12 and not for thermal conduction, the depression in the plated layer 40' will not affect the thermal transfer properties between the transistor 10 and ground plane 40'. Acceptable electrical contact, however, is provided between the source overlay 16 and layer 40' by the portion of layer 40' disposed in the via 36. The principal region used for thermal conduction is the tub structure 30 disposed under the transistor. Therefore, as shown in FIG. 6, the portion of layer 40 disposed on the tub structure 30 has a uniform, continuous surface which may be bonded to a carrier 50 using a suitable conductive adhesive 52 such as solder without void or air pockets, and thus will provide a low thermal resistance path between the field effect transistor 10 and the carrier 50.

Having described preferred embodiments in the invention, it will now become apparent to those of skill in the art that other embodiments incorporating their concepts may be used. It is felt, therefore, that these embodiments should not be limited to disclosed embodiments, but rather should be limited only by the spirit and scope of the appended claims.

What is claimed is:

1. A semiconductor circuit, comprising:
   a semiconductor substrate;
   a heat dissipating element formed over a first surface of said substrate with a second opposing surface of said substrate having a recess disposed therein, and disposed substantially under said heat dissipating element;
   a continuous, substantially uniform conductive layer disposed over said second opposing surface of said substrate and having portions thereof substantially filling the recess provided in said substrate; and
   a via hole disposed through said substrate having a conductive material disposed therein, said conductive material further disposed in electrical contact between said continuous, substantially uniform conductive layer disposed over said second opposing surface of said substrate and a conductive layer disposed on the first surface of said substrate.

2. The semiconductor circuit as recited in claim 1 wherein said heat dissipating element is a transistor.

3. The semiconductor circuit as recited in claim 2 wherein the transistor comprises:
   an active, semiconductor region having a predetermined dopant concentration disposed over the first surface of said substrate;
   at least one drain contact disposed over the active region in ohmic contact with said region;
   at least one source contact disposed over the active region in ohmic contact with said region; and
   at least one gate contact disposed in Schottky-barrier contact with said region.

4. A semiconductor circuit, comprising:
   a semi-insulating substrate having first and second, opposing surfaces;
   a transistor supported by said first surface of said substrate comprising:
      an active semiconductor region having a predetermined dopant concentration supported by the substrate;
      at least one drain contact disposed over the active region in ohmic contact with said region;
      at least one source contact disposed over the active region in ohmic contact with said region; and at least one gate contact disposed in Schottky-barrier contact with said region;

said substrate having a recess disposed partially through the second opposing surface of said substrate, in a region of said substrate substantially underlying said transistor; and a continuous, substantially uniform conductive layer disposed over said second opposing surface of said substrate, having portions thereof disposed in the recess provided in said substrate, with said portions disposed in the recess further disposed in electrical contact only with the semi-insulating substrate.

5. The semiconductor circuit as recited in claim 4 wherein said substrate has a via hole disposed through said substrate having a conductive material disposed therein, said conductive material further disposed in electrical contact between said continuous, substantially uniform conductive layer disposed over said second opposing surface of said substrate and the source contact disposed over said active region.

6. The circuit recited in claim 4 wherein the continuous, substantially uniform conductive layer disposed over the second opposing surface of said substrate has portions thereof substantially filling the recess.

* * * * *